(12) United States Patent
Wang et al.

(10) Patent No.: US 8,000,107 B2
(45) Date of Patent: Aug. 16, 2011

(54) CARRIER WITH EMBEDDED COMPONENT AND METHOD FOR FABRICATING THE SAME

(75) Inventors: Yung-Hui Wang, Kaohsiung (TW); In-De Ou, Kaohsiung (TW); Chih-Pin Hung, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 810 days.

(21) Appl. No.: 12/078,330

(22) Filed: Mar. 28, 2008

(65) Prior Publication Data

US 2008/0273313 A1 Nov. 6, 2008

(30) Foreign Application Priority Data

Mar. 29, 2007 (TW) ................................ 96111122 A

(51) Int. Cl.
*H01L 23/495* (2006.01)

(52) U.S. Cl. ........ 361/761; 361/760; 361/764; 257/668; 257/673; 257/675; 174/250; 174/260; 174/265

(58) Field of Classification Search .................. 361/753, 361/760–766, 784, 792–795, 799, 800; 257/668, 257/678, 750, 686, 773, 774, 777, 737, 679, 257/691, 693, E21.499, E33, E23.023, E21.5, 257/E21.514; 174/255, 260, 261, 262, 265, 174/266; 29/830, 840, 846, 852, 890; 438/107, 438/108, 118, 584
See application file for complete search history.

(56) References Cited

U.S. PATENT DOCUMENTS 6,194,778 B1 * 2/2001 Ohsawa et al. ............... 257/668
* cited by examiner

*Primary Examiner* — Michael V Datskovskiy
(74) *Attorney, Agent, or Firm* — Muncy, Geissler, Olds & Lowe, PLLC

(57) ABSTRACT

A carrier with embedded components comprises a substrate and at least one embedded component. The substrate has at least one slot and a first composite layer. The embedded component is disposed at the slot of the substrate. The first composite layer has a degassing structure, at least one first through hole and at least one first fastener, wherein the degassing structure corresponds to the slot, the first through hole exposes the embedded component, and the first fastener is formed at the first through hole and contacts the embedded component. According to the present invention, the degassing structure can smoothly discharge the hydrosphere existing within the carrier under high temperature circumstances and the first fastener is in contact with the embedded component, which increases the joint strength between the embedded component and the substrate.

20 Claims, 13 Drawing Sheets

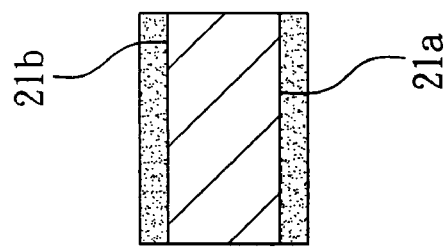
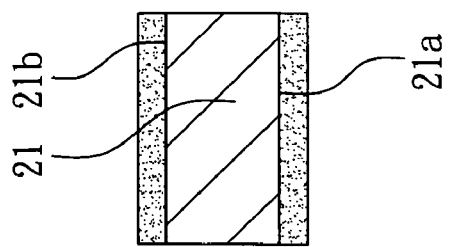
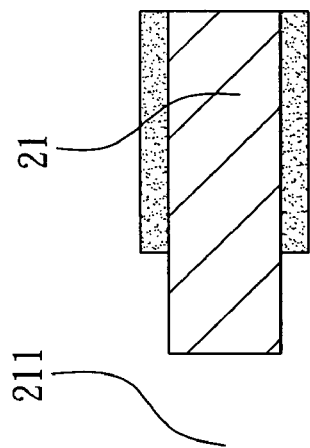
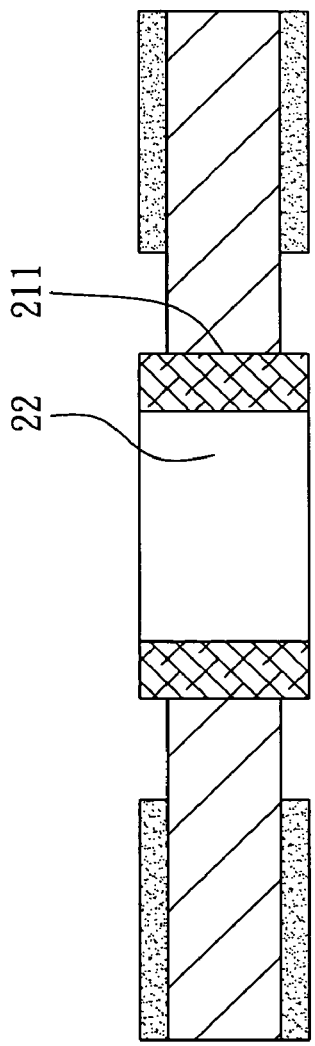
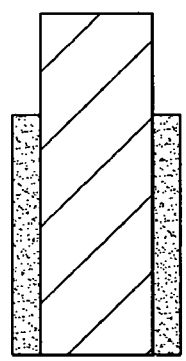
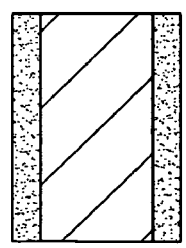
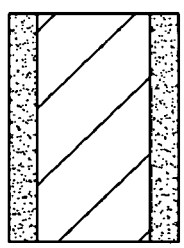
FIG. 10A
FIG. 10B

CARRIER WITH EMBEDDED COMPONENT AND METHOD FOR FABRICATING THE SAME

FIELD OF THE INVENTION

The present invention is generally relating to a carrier, and more particularly to a carrier having an embedded component.

BACKGROUND OF THE INVENTION

A conventional carrier 10 with embedded component shown in FIG. 1 basically comprises a substrate 11 and at least one embedded component 12. The substrate 11 has an opening 111, at least one wiring layer 112, at least one dielectric layer 113 and an adhesive layer 114. The embedded component 12 is disposed at the opening 111 of the substrate 11, the wiring layer 112 covers the dielectric layer 113 and the adhesive layer 114 is disposed between the embedded component 12 and the opening 111, the embedded component 12 and the dielectric layer 113 respectively in order to adhere the embedded component 12 to the substrate 11. The conventional dielectric layer 113 and adhesive layer 114 are made of a material which has a moisture-absorbing or dampening characteristic and the moisture absorbed by the dielectric layer 113 and the adhesive layer 114 will become hydrosphere during high temperature process (such as compressing process, curing process or reflowing process). In addition, the wiring layer 112 of the carrier 10 is a gas-proof metal layer and covers the dielectric layer 113, so that the hydrosphere existing within the carrier 10 cannot be discharged smoothly and may result in forming air voids within the carrier 10 or delamination at the material interface, thereby seriously affecting the reliability of the carrier 10. Besides, because the joint strength between the conventional embedded component 12 and the substrate 11 is not strong enough, slits or cracks easily occur between the embedded component 12 and the substrate 11 when encountering impact from an external force or a temperature cycling test, which may influence the electrical interconnection between the embedded component 12 and the substrate 11.

SUMMARY

The primary object of the present invention is to provide a carrier with embedded component and method for fabricating the same. The carrier comprises a substrate having at least one slot and a first composite layer and at least one embedded component disposed at the slot of the substrate. The first composite layer has a degassing structure, at least one first through hole and at least one first fastener, wherein the degassing structure corresponds to the slot, the first through hole exposes the embedded component, and the first fastener is formed at the first through hole and contacts the embedded component. According to the present invention, the degassing structure can smoothly discharge the hydrosphere existing within the carrier under high temperature circumstances and the first fastener is in contact with the embedded component, which enhances the joint strength between the embedded component and the substrate.

A carrier with embedded component according to the present invention comprises a substrate and at least one embedded component. The substrate has at least one slot and a first composite layer, the embedded component is disposed at the slot of the substrate, and the first composite layer has a degassing structure corresponding to the slot.

A method for fabricating the carrier with embedded component according to the present invention comprises providing a substrate that has at least one slot, disposing at least one embedded component at the slot of the substrate and forming a first composite layer on the substrate. The first composite layer has a degassing structure corresponding to the slot.

DESCRIPTION OF THE DRAWINGS

FIG. 10A-10E is a flow chart for fabricating a carrier with embedded component in accordance with a further preferred embodiment of the present invention.

DETAILED DESCRIPTION OF THE INVENTION

Figure 1:
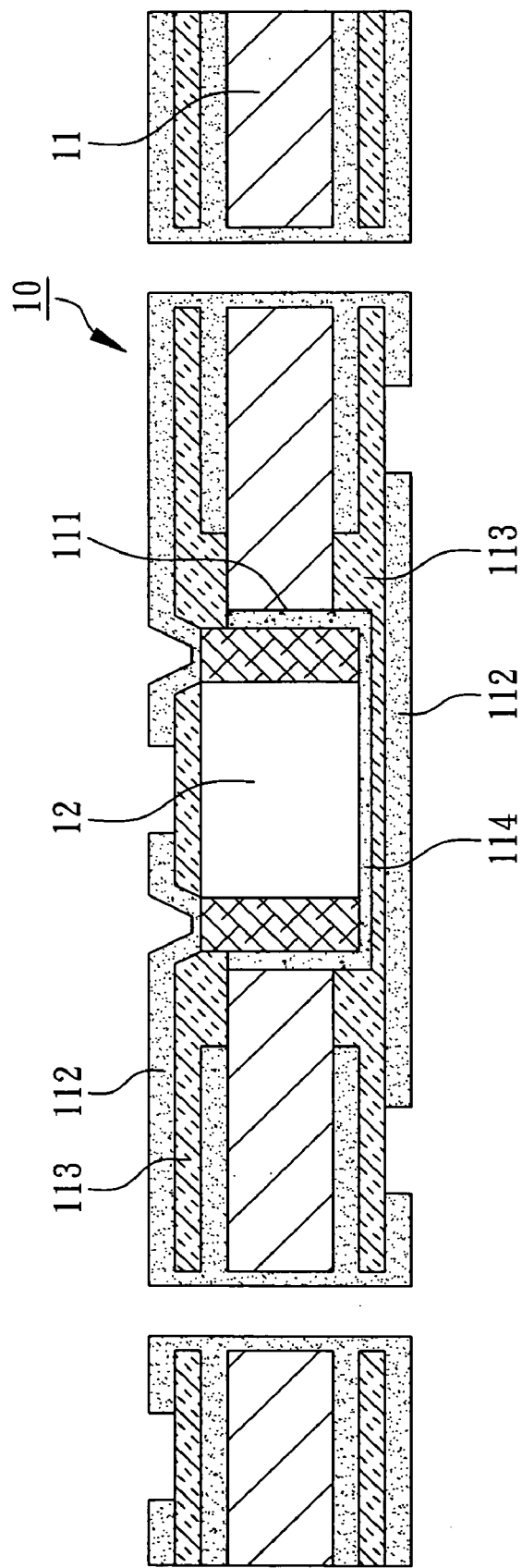
FIG. 1 is a constructional view of a conventional carrier with embedded component.
Figure 2:
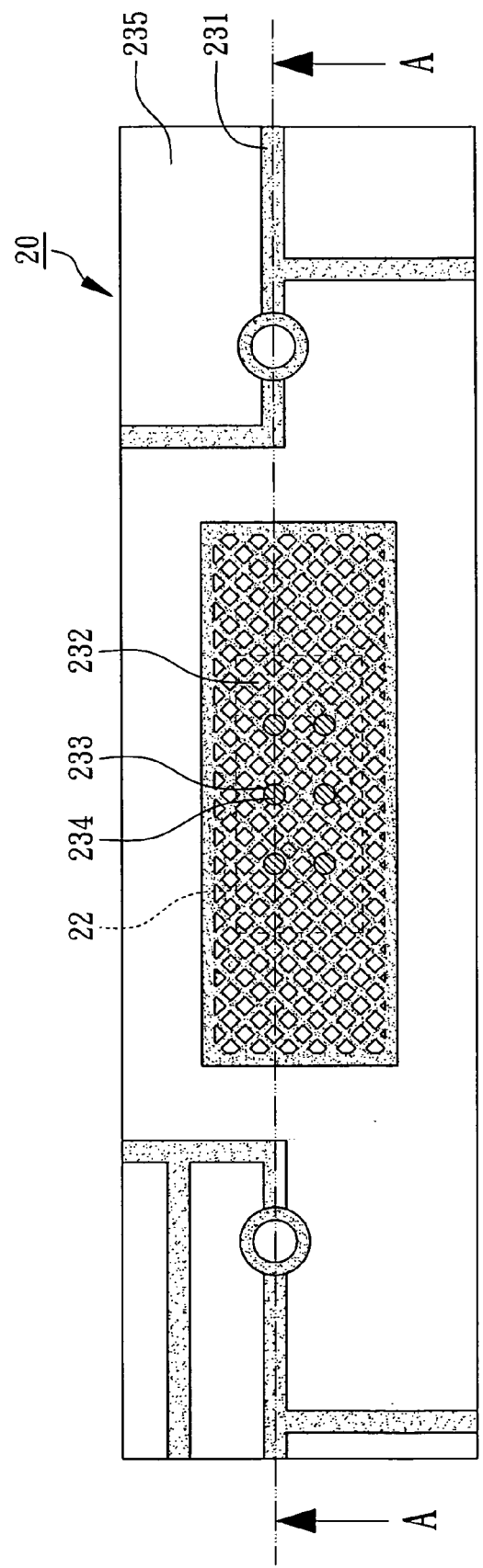
FIG. 2 is a bottom view of a carrier with embedded component in accordance with a preferred embodiment of the present invention.
Figure 3:
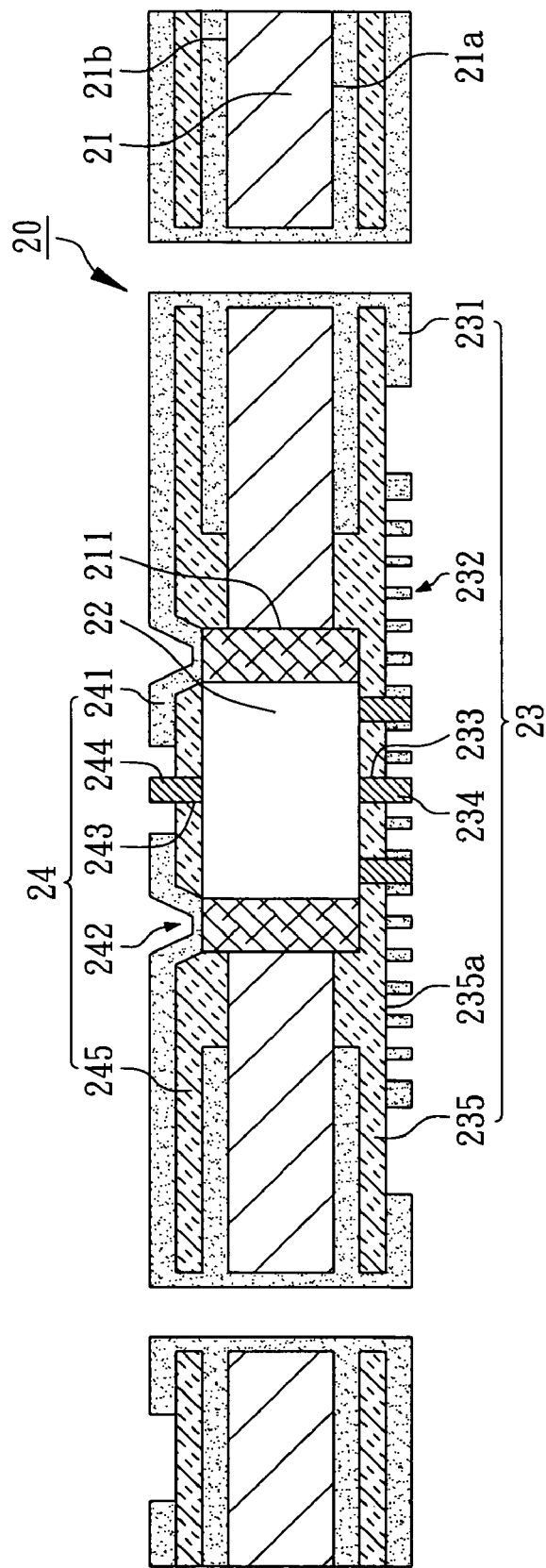
FIG. 3 is a constructional cutaway view of the carrier along A-A line of FIG. 2.

As shown in FIGS. 2 and 3, a carrier 20 with embedded component according to a preferred embodiment of the present invention comprises a substrate 21 and at least one embedded component 22. The substrate 21 can be a core layer and has a first surface 21a, a second surface 21b, at least one slot 211, a first composite layer 23 and a second composite layer 24. The slot 211 is recessed from the first surface 21a of the substrate 21 and the embedded component 22 is disposed at the slot 211 of the substrate 21. In this embodiment, the slot 211 interconnects the first and second surfaces 21a, 21b. The first composite layer 23 is formed on the first surface 21a of the substrate 21 and has a first wiring layer 231, a degassing structure 232 corresponding to the slot 211, at least one first through hole 233, at least one first fastener 234 and a first dielectric layer 235. The first through hole 233 penetrates the first composite layer 23 and exposes the embedded component 22. The first fastener 234 is formed at the first through hole 233 and contacts the embedded component 22 as to improve the joint strength between the embedded component 22 and the substrate 21. The first fastener 234 is preferably a metal plating layer and the first dielectric layer 235 is formed between the first wiring layer 231 and the first surface 21a of the substrate 21. In this embodiment, the first wiring layer 231 can be integrally formed with the degassing structure 232 and the first dielectric layer 235 has a plurality of exposed surfaces 235a, wherein the degassing structure 232 is in meshed shape to expose the exposed surfaces 235a of the first dielectric layer 235 and the hydrosphere existing within the carrier 20 can be discharged smoothly via the exposed surfaces 235a.

Figure 4:
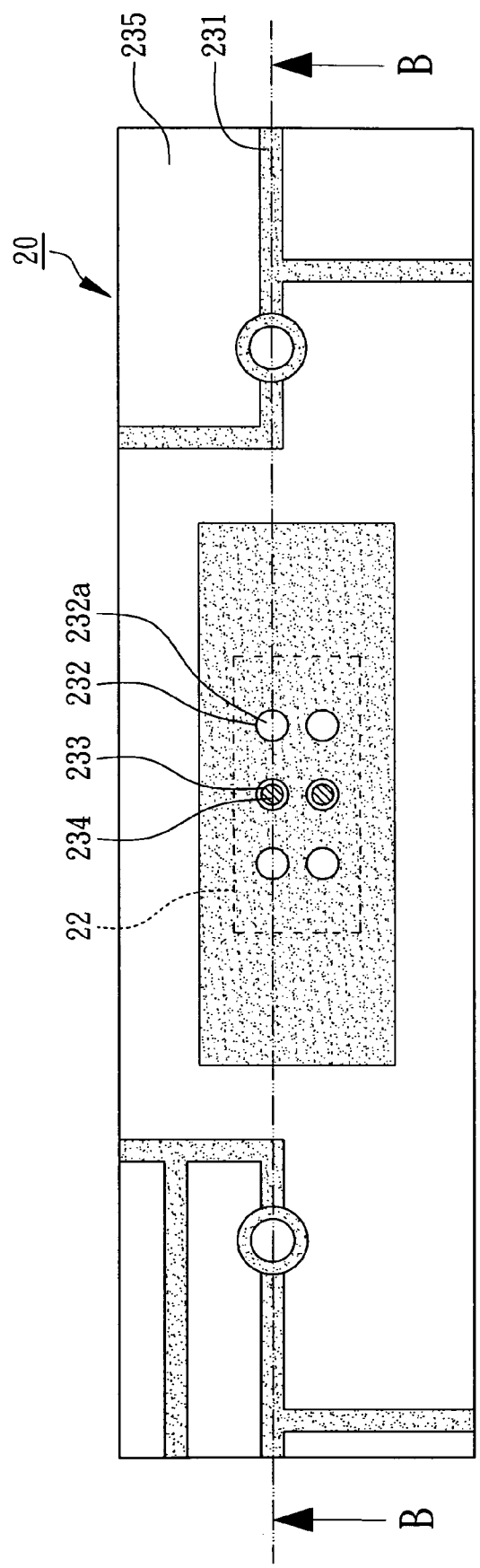
FIG. 4 is a bottom view of a carrier with embedded component in accordance with a further embodiment of the present invention.
Figure 5:
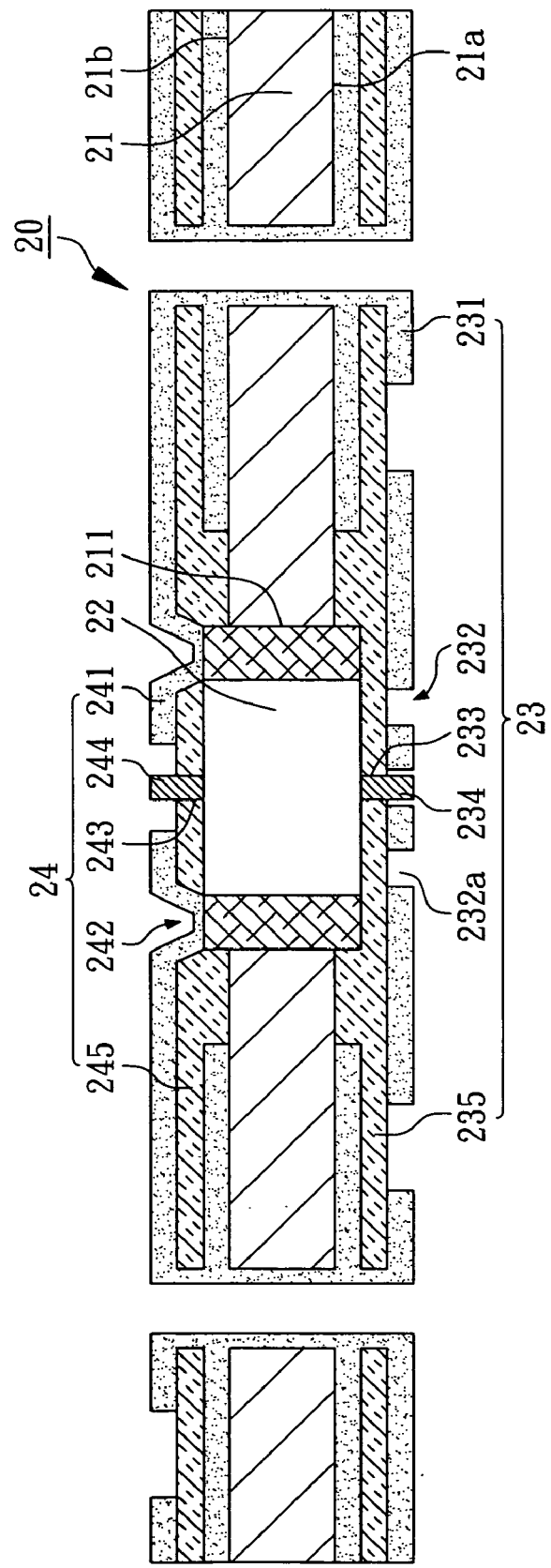
FIG. 5 is a constructional cutaway view of the carrier along B-B line of FIG. 4.
Figure 6:
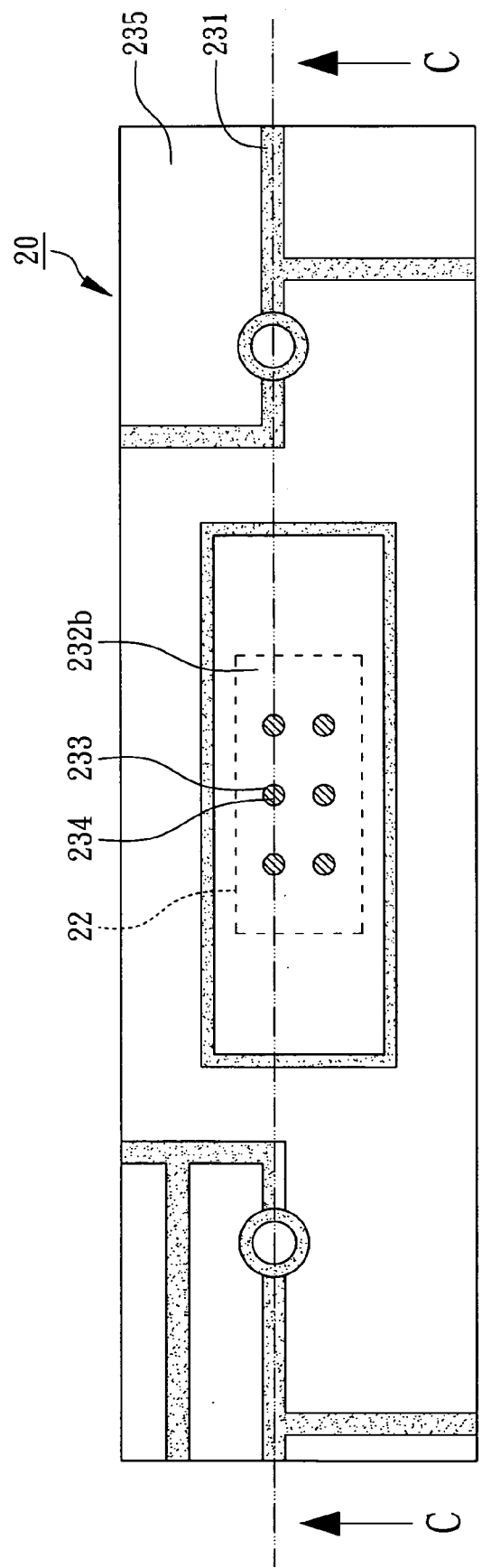
FIG. 6 is a bottom view of a carrier with embedded component in accordance with a further embodiment of the present invention.
Figure 7:
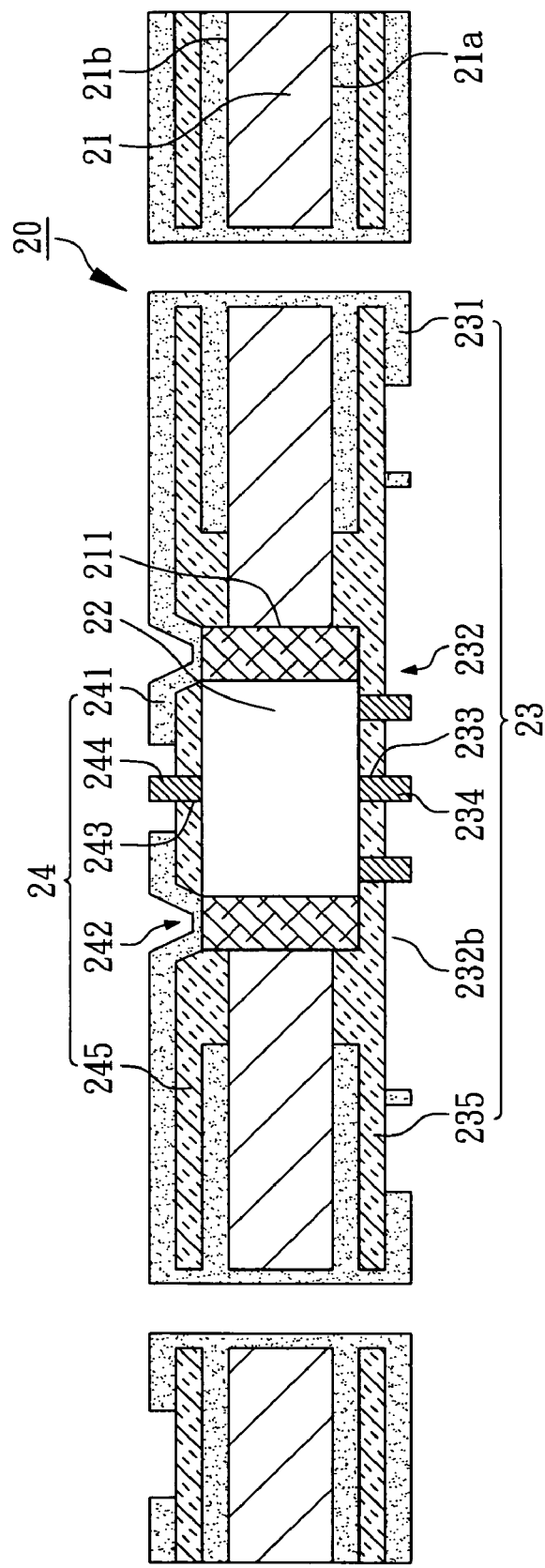
FIG. 7 is a constructional cutaway view of the carrier along C-C line of FIG. 6.

Otherwise, in another embodiment shown in FIGS. 4 and 5, the degassing structure 232 has a plurality of vents 232a which penetrate the first wiring layer 231 of the first composite layer 23 allowing the hydrosphere existing within the carrier 20 to be discharged smoothly via the vents 232a, wherein the vents 232a have various shapes, such as circular, annular, quadrate or other geometric shapes. Furthermore, in a further embodiment shown in FIGS. 6 and 7, the degassing structure 232 has a degassing cavity 232b corresponding to the embedded component 22 to expose the first dielectric layer 235. The degassing cavity 232b provides a bigger degassing area, which increases the degassing efficiency.

Figure 8:
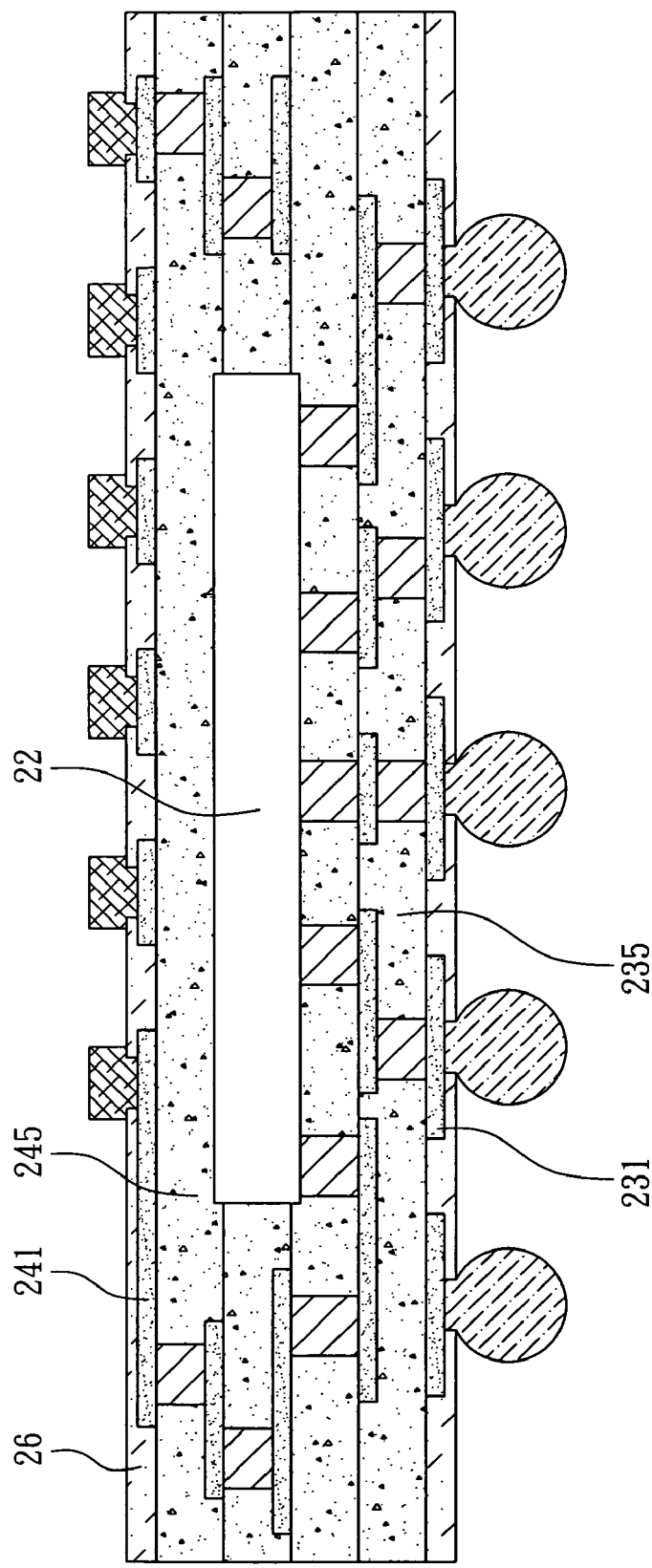
FIG. 8 is a constructional cutaway view of a carrier with embedded component in accordance with a further preferred embodiment of the present invention.

As shown in FIG. 3, the second composite layer 24 is formed on the second surface 21b of the substrate 21 and has a second wiring layer 241, a plurality of plating holes 242, at least one second through hole 243, at least one second fastener 244 and a second dielectric layer 245. The plating holes 242 correspond to the embedded component 22, the second through hole 243 penetrates the second composite layer 24 and exposes the embedded component 22, the second fastener 244 is formed at the second through hole 243 and contacts the embedded component 22 as to improve the joint strength between the embedded component 22 and the substrate 21. The second fastener 244 is preferably a metal plating layer and the second dielectric layer 245 is formed between the second wiring layer 241 and the second surface 21b of the substrate 21. In this embodiment, the plating holes 242 are electrically connected with the embedded component 22 and the embedded component 22 is a passive component, such as a resistor, a capacitor or an inductor. Otherwise, in another embodiment shown in FIG. 8, the embedded component can be an active component, such as a semiconductor chip or an IC.

Figure 9:
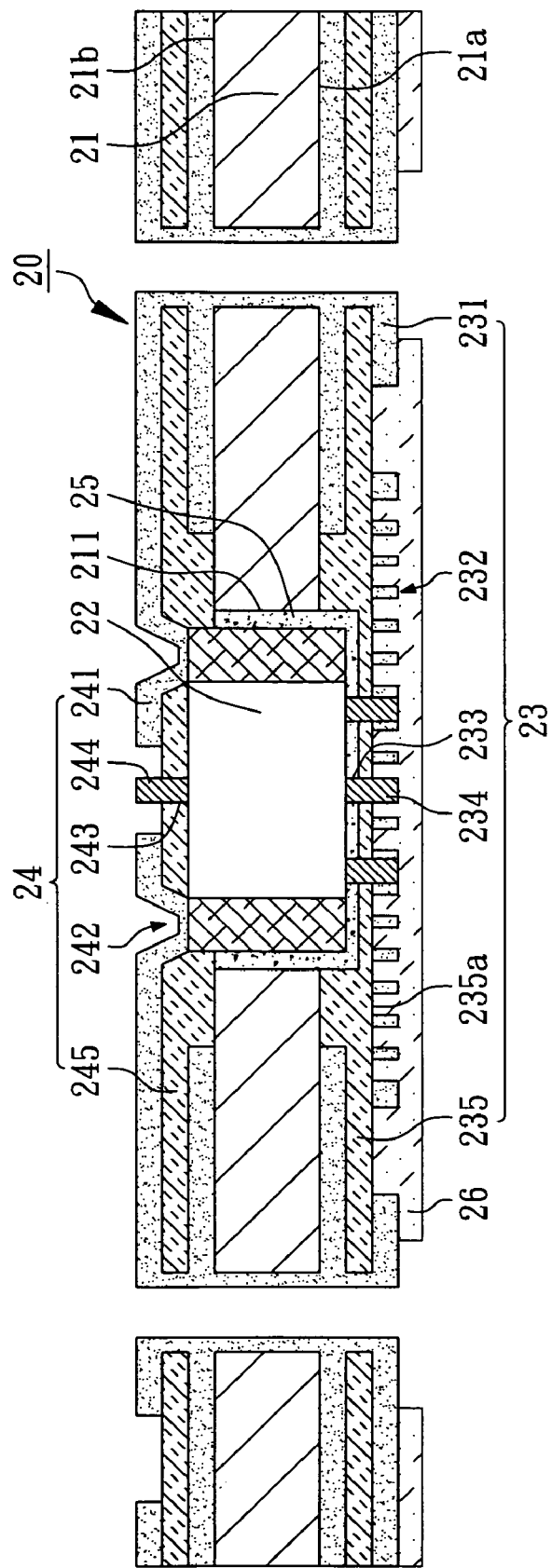
FIG. 9 is a constructional view of a carrier having an adhesive layer and a solder mask layer in accordance with a further embodiment of the present invention.

In a further embodiment shown in FIG. 9, the substrate 21 further has an adhesive layer 25 and a solder mask layer 26. The adhesive layer 25 is formed between the embedded component 22 and the slot 211 and preferably also formed between the embedded component 22 and the first composite layer 23. The first through hole 233 penetrates the adhesive layer 25 to allow the first fastener 234 formed at the first through hole 233 to contact the embedded component 22. Besides, the solder mask layer 26 covers the degassing structure 232 of the first composite layer 23 for preventing the degassing structure 232 from contaminating by the dust. In this embodiment, the material of the solder mask layer 26 is also able to smoothly discharge the hydrosphere existing within the carrier 20.

FIG. 10A-10D illustrates the method for fabricating the carrier 20 of the present invention. Initially, a substrate 21 is provided shown in FIG. 10A and which can be a core layer and has a first surface 21a, a second surface 21b and at least one slot 211. In this embodiment, the slot 211 is recessed from the first surface 21a of the substrate 21 and interconnects the first and second surfaces 21a, 21b. Next, at least one embedded component 22 is disposed at the slot 211 of the substrate 21 shown in FIG. 10B, in this embodiment, the embedded component 22 can be a passive component or an active component. Then, a first composite layer 23 is formed on the first surface 21a and a second composite layer 24 is formed on the second surface 21b shown in FIG. 10C. The first composite layer 23 has a first wiring layer 231, a degassing structure 232 corresponding to the slot 211 of the substrate 21, at least one first through hole 233, at least one first fastener 234 and a first dielectric layer 235. The first through hole 233 penetrates the first composite layer 23 and exposes the embedded component 22. The first fastener 234 is formed at the first through hole 233 and contacts the embedded component 22 as to improve the joint strength between the embedded component 22 and the substrate 21. The first dielectric layer 235 is formed between the first wiring layer 231 and the first surface 21a of the substrate 21. Preferably, the first wiring layer 231 is integrally formed with the degassing structure 232 and the first dielectric layer 235 has a plurality of exposed surfaces 235a, wherein the degassing structure 232 is in meshed shape to expose the exposed surfaces 235a of the first dielectric layer 235 and the hydrosphere existing within the carrier 20 can be discharged smoothly via the exposed surfaces 235a.

In this embodiment referring again to FIG. 10C, the second composite layer 24 has a second wiring layer 241, a plurality of plating holes 242 corresponding to the embedded component 22, at least one second through hole 243, at least one second fastener 244 and a second dielectric layer 245. The second through hole 243 penetrates the second composite layer 24 and exposes the embedded component 22. The second fastener 244 is formed at the second through hole 243 and contacts the embedded component 22 as to improve the joint strength between the embedded component 22 and the substrate 21. The second dielectric layer 245 is formed between the second wiring layer 241 and the second surface 21b of the substrate 21. The plating holes 242 are electrically connected with the embedded component 22 in this embodiment. Besides, the first through hole 233 of the first composite layer 23 and the second through hole 243 of the second composite layer 24 can be formed by using the method of laser drilling, machine drilling or photolithography, the first fastener 234 and the second fastener 244 can be formed by using the electroplating or electroless plating method.

Figure 10C:
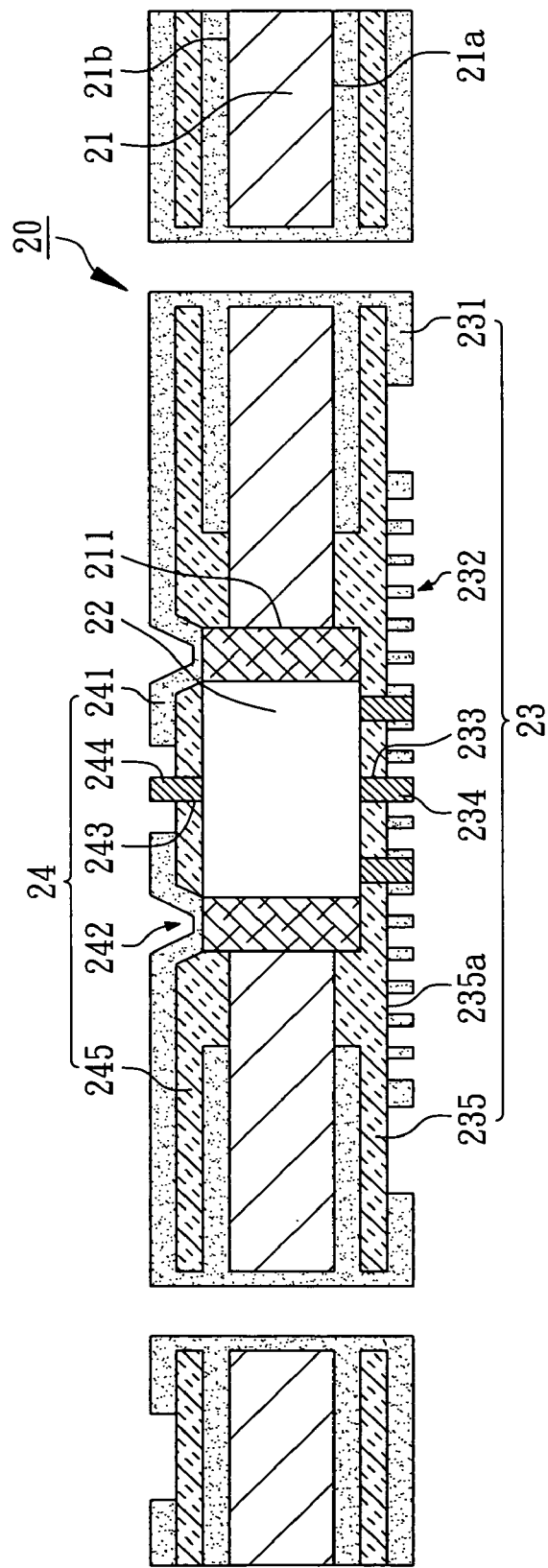
Figure 10D:
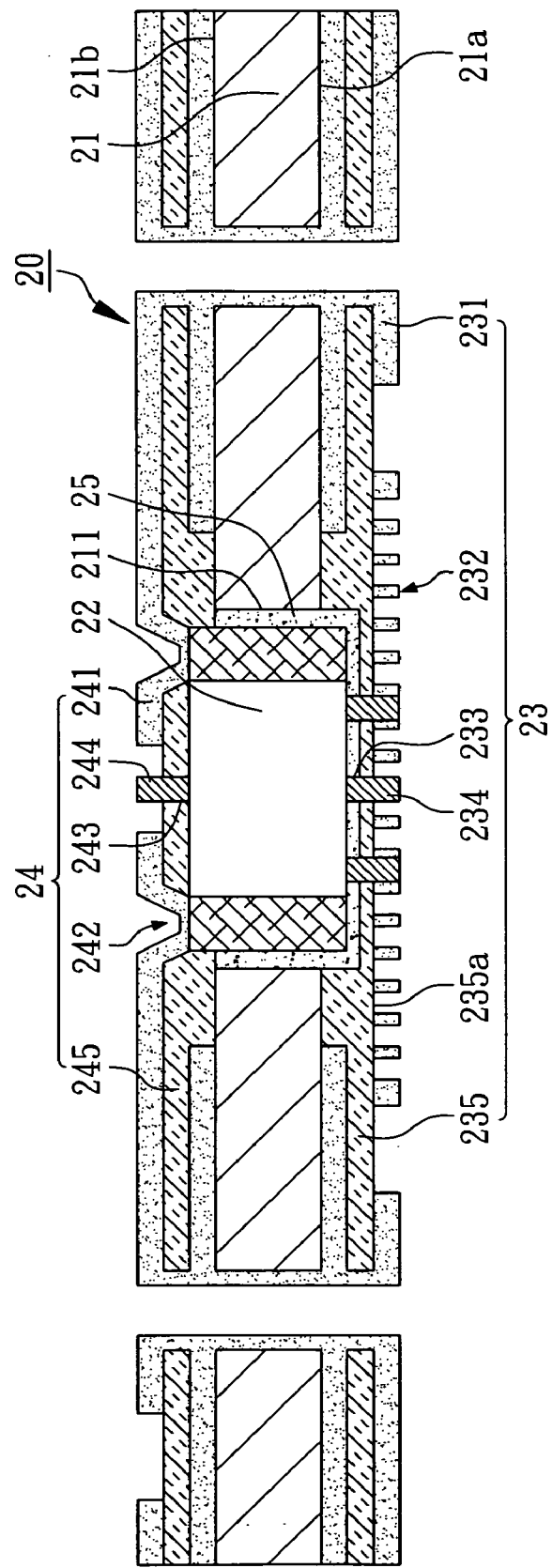
Figure 10E:
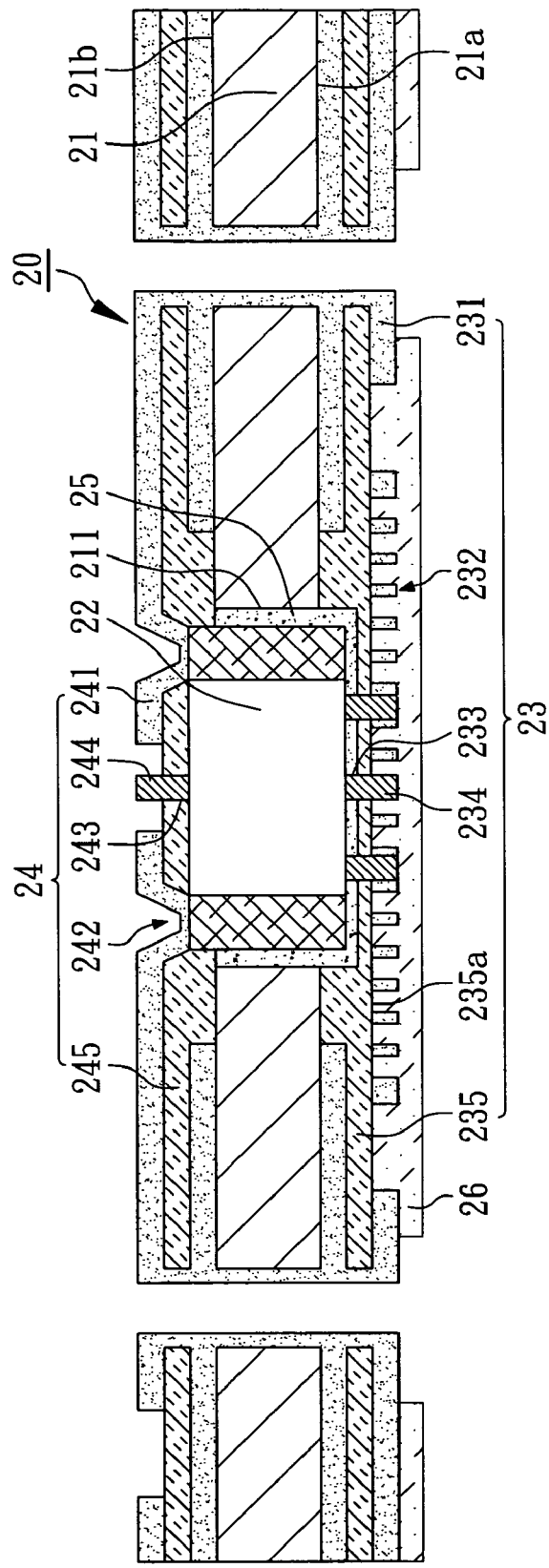

In addition, in another embodiment shown in FIG. 10D, it further comprises forming an adhesive layer 25 between the embedded component 22 and the slot 211 and preferably also formed between the embedded component 22 and the first composite layer 23. The first through hole 233 penetrates the adhesive layer 25 to allow the first fastener 234 formed at the first through hole 233 to contact the embedded component 22. In a further embodiment shown in FIG. 10E, it further comprises forming a solder mask layer 26 to cover the degassing structure 232 of the first composite layer 23 to prevent the degassing structure 232 from contaminating by the dust. In this embodiment, the material of the solder mask layer 26 is also able to smoothly discharge the hydrosphere existing within the carrier 20. Furthermore, it may further comprise a step of performing a surface treatment for increasing the joint strength between the first fastener 234 and the embedded component 22 or the second fastener 244 and the embedded component 22. Performing a surface treatment for the embedded component 22 increases the surface roughness of the embedded component 22. In this embodiment, the surface treating method can be a physical surface treatment or a chemical surface treatment. Preferably, the plasma surface treatment is adopted. Moreover in a further embodiment, a brown oxide process is performed on a portion of the electrode region of the embedded component 22 where there is no electrical connection, thereby increasing the joint strength between the adhesive layer 25 and the embedded component 22.

According to the present invention, the degassing structure 232 can smoothly discharge the hydrosphere existing within the carrier 20 under high temperature circumstances and the first fastener 234 and the second fastener 244 are in contact with the embedded component 22, which increases the joint strength between the embedded component 22 and the substrate 21.

While the present invention has been particularly illustrated and described in detail with respect to the preferred embodiments thereof, it will be clearly understood by those skilled in the art that various changed in form and details may be made without departing from the spirit and scope of the present invention.

What is claimed is:

1. A carrier with embedded component comprising:
   a substrate having a first surface, a second surface, at least one slot and a first composite layer formed on the first surface, wherein the first composite layer has a degassing structure corresponding to the slot and at least one first through hole; and
   at least one embedded component disposed at the slot of the substrate and exposed by the first through hole.

2. The carrier with embedded component in accordance with claim 1, wherein the first composite layer has a first wiring layer integrally formed with the degassing structure.

3. The carrier with embedded component in accordance with claim 2, wherein the degassing structure has a plurality of vents penetrating the first wiring layer.

4. The carrier with embedded component in accordance with claim 2, wherein the degassing structure is in meshed shape.

5. The carrier with embedded component in accordance with claim 2, wherein the degassing structure has a degassing cavity corresponding to the embedded component.

6. The carrier with embedded component in accordance with claim 2, wherein the first composite layer has a first dielectric layer formed between the first wiring layer and the first surface of the substrate.

7. The carrier with embedded component in accordance with claim 1, wherein the first composite layer has at least one first fastener formed at the first through hole.

8. The carrier with embedded component in accordance with claim 7, wherein the first fastener contacts the embedded component.

9. The carrier with embedded component in accordance with claim 1, wherein the substrate has an adhesive layer formed between the embedded component and the first composite layer.

10. The carrier with embedded component in accordance with claim 9, wherein the first through hole penetrates the adhesive layer.

11. The carrier with embedded component in accordance with claim 1, wherein the slot interconnects the first and second surfaces.

12. The carrier with embedded component in accordance with claim 1, wherein the substrate has a second composite layer formed on the second surface of the substrate.

13. The carrier with embedded component in accordance with claim 12, wherein the second composite layer has a second wiring layer and a second dielectric layer formed between the second wiring layer and the second surface of the substrate.

14. The carrier with embedded component in accordance with claim 12, wherein the second composite layer has a plurality of plating holes corresponding to the embedded component.

15. The carrier with embedded component in accordance with claim 14, wherein the plating holes are electrically connected with the embedded component.

16. The carrier with embedded component in accordance with claim 12, wherein the second composite layer has at least one second through hole exposing the embedded component.

17. The carrier with embedded component in accordance with claim 16, wherein the second composite layer has at least one second fastener formed at the second through hole.

18. The carrier with embedded component in accordance with claim 17, wherein the second fastener contacts the embedded component.

19. The carrier with embedded component in accordance with claim 1, wherein the substrate has an adhesive layer formed between the embedded component and the slot.

20. The carrier with embedded component in accordance with claim 1, wherein the substrate has a solder mask layer covering the degassing structure of the first complex layer.

* * * * *